United States Patent [19]

Taniguchi

[11] Patent Number: 4,841,339
[45] Date of Patent: Jun. 20, 1989

[54] IMAGE FORMING METHOD
[75] Inventor: Isao Taniguchi, Kanagawa, Japan
[73] Assignee: Fuji Photo Film Co., Ltd., Kanagawa, Japan
[21] Appl. No.: 167,285
[22] Filed: Mar. 11, 1988
[30] Foreign Application Priority Data
 Mar. 12, 1987 [JP] Japan .................................. 62-55243
 Mar. 12, 1987 [JP] Japan .................................. 62-55244
[51] Int. Cl.⁴ ...................... G03B 27/32; G03B 27/52; B65H 20/24
[52] U.S. Cl. ................................... 355/27; 226/111
[58] Field of Search ............................ 355/27, 50, 51; 430/138; 354/303-305, 297, 86, 339; 226/111, 25, 40, 195

[56]         References Cited
         U.S. PATENT DOCUMENTS
 3,764,050 10/1973 Clark ........................................ 226/25
 3,837,550  9/1974 Levy ................................... 226/111 X
 4,007,866  2/1977 Traise ................................. 226/111 X
 4,727,392  2/1988 Stone et al. ........................ 355/27 X
 4,748,475  5/1988 Ishiyama et al. ....................... 355/27
 4,777,513 10/1988 Nelson ................................... 355/27
 4,785,332 11/1988 Nagumo et al. ....................... 355/27

Primary Examiner—Richard A. Wintercorn
Attorney, Agent, or Firm—Sughrue, Mion, Zinn, Macpeak & Seas

[57]            ABSTRACT

An image forming method for use with a photosensitive and pressure-sensitive material fed from a supply position to an exposure position by entrance-side and exit-side nip rollers disposed on opposite side of the exposure position in contact with an exposed material supporting roller. To eliminate sag from the sensitive material, the entrance-side and exit-side rollers are operated with a differential timing. To reduce the per sheet exposure time, a fresh segment of the photosensitive and pressure-sensitive material is fed to the exposure position immediately following each exposure operation.

9 Claims, 2 Drawing Sheets

IMAGE FORMING METHOD

BACKGROUND OF THE INVENTION

The present invention relates to an image forming method using a photosensitive and pressure-sensitive (hereinafter sometimes simply "sensitive") material incorporating microcapsules containing a photosensitive composition. Particularly, the invention relates to a method of removing sag in the exposure portion of such photosensitive and pressure-sensitive material during image formation, and a method for positional control of the photosensitive and pressure-sensitive material during image formation.

Examples of photosensitive and pressure-sensitive materials employing microcapsules containing a photosensitive composition, a system having a support which carries thereon synthetic-high-molecular-resin-walled capsules containing a vinyl compound, a photopolymerization initiator, and a colorant precursor are disclosed in commonly assigned Japanese Unexamined Patent Publication No. 57-179836. In an image recording method using such a system, the microcapsules are hardened in the form of an image by an exposure process, and the not-hardened microcapsules are broken by pressure to release a colorant precursor to thereby obtain a color image. The method has the advantage that a high quality image can be obtained with a dry-type simple treatment. However, the method has the disadvantage that this system is inferior in photosensitivity to a system using silver halide.

A recording material having an improved photosensitivity such that a high quality image can be obtained with a drytype simple treatment has been disclosed in commonly assigned Japanese Unexamined Patent Publication No. 61-275742. The disclosed recording material includes a support on which at least photosensitive silver halide, a reducing agent, a polymerizable compound and a color image forming matter are applied. The polymerizable compound and the color image forming matter are enclosed in the same microcapsules as a photosensitive compound.

An image forming method in which this photosensitive and pressure-sensitive material is used to form an image has been disclosed in commonly assigned Japanese Unexamined Patent Publication No. 61-278849. According to that image forming method, a latent image is formed by imaging exposure. Then, development is carried out by heating so that a part of the polymerizable compound in portions containing a latent image is polymerized to produce in those portions a high molecular compound to thereby harden the microcapsules. Next, pressure is exerted on the material while it is superposed on an image-receiving material having an image-receiving layer to which the color image forming matter can be transferred so that at least part of other microcapsules located out of the portion containing the latent image are ruptured to transfer the color image forming matter to the image-receiving material to thereby obtain a picture image on the image-receiving material.

As an example, an image forming apparatus using the aforementioned photosensitive and pressure-sensitive material and automatically performing the above-described procedures (of forming a latent image on the photosensitive and pressure-sensitive material through exposure, carrying out development by heating, and applying pressure to the material superposed on an image-receiving material to obtain a picture image on the image-receiving material) is disclosed in Japanese Patent Application No. 60-287492.

An exposure section and an exposure method according to the apparatus and method of the type described above are as follows:

FIG. 1 shows an image forming apparatus to which the present invention can be applied. In FIG. 1, a glass plate 3 carrying an original placed upside down moves in the directions of an arrow A.

An illuminating lamp 8 and a mirror 6 are provided under the glass plate 2 to illuminate the original. Further, a fiber-optics lens array 10 is provided under the glass plate 3 to form an image of the original on a photosensitive and pressure-sensitive material S at a predetermined exposure position.

A cartridge 14 containing a roll 12 of the photosensitive and pressure-sensitive material S is removably attached to a side of a housing 1. A pair of draw-out rollers 21 and 22 housed in a magazine connection dark box 20 are disposed at the exit 16 of the photosensitive and pressure-sensitive material S from the cartridge 14 so that the material S wound on the roll 12 can be drawn out in segments of a predetermined length or pulled back into the cartridge 14 if occasion demands.

When the forward end of the photosensitive and pressure-sensitive material S advances to the pair of rollers 21 and 22, the rollers 21 and 22 are moved apart to thereby facilitate the advancing of the material S. A cutter unit 23 for cutting the material S is disposed in front of the magazine connection dark box 20. (The term "front" as used herein means downstream with respect to the advancing direction of the photosensitive and pressure-sensitive material S). The cutter unit 23 is followed by a guide plate 24.

An exposed material supporting roller 26 and a pair of nip rollers 28 and 30 in forced contact with the roller 26 are disposed in front of the guide plate 24. The material S, guided by the guide plate 24, is brought into contact with the exposed material supporting roller 26 by the pair of nip rollers 28 and 30, and then the material S at a middle position between the nip rollers 28 and 30 is exposed to light carrying an image of the original through the fiberoptics lens array 10.

A thermal developing device 40 for thermally developing the exposed sensitive material S is disposed in front of the exposed sensitive material supporting roller 26. After being heated to about 120° C. to develop it with the thermal developing device 40, the photosensitive and pressure-sensitive material S is passed through a vertical guide device 58 to a superposing device 70 and there superposed on an image-receiving paper C fed from an image-receiving paper cartridge 73. A pressure of about 500 kg/cm$^2$ is applied to the superposed material S by a transfer device 88 to transfer a picture image to the image-receiving paper. The photosensitive and pressure-sensitive material S, which is then spent, is then separated from the image-receiving paper C having the image formed thereon by a peel-off device 90 and then discarded.

However, since a thin material is used a support in the photosensitive and pressure-sensitive material, the material curls easily. Accordingly, as shown in FIG. 2, in the case where the material S entering at the exposure entrance-side nip roller 28 is nipped by the exit-side nip roller 30, with the forward end of the material S being in a curled state, the material 32 at the exposure position tends to float up from the exposure roller. This of course interferes with proper image formation, causing a focusing error during image exposure.

Moreover, in the aforementioned apparatus, the standby position of the photosensitive and pressure-sensitive material S prior to exposure is located between the draw-out rollers 21 and 22, that is, just after the material exits from the cartridge, whereas the operating position of the material S is at the position of the cutter unit 23.

When a copy start key is pushed, exposure can be started only after the photosensitive and pressure-sensitive material S has been transported from the standby position to the exposure position. Accordingly, the time required for duplicating each sheet is undesirably long.

SUMMARY OF THE INVENTION

It is therefore an object of the present invention to overcome the aforementioned problems of the prior art.

It is another object of the present invention to provide an image forming method in which the sensitive material is held at the exposure portion in such a manner as to make it always possible to carry out exposure with an accurately focused image.

The foregoing and other objects of the invention are attained by removing the sag of the sensitive material by delaying the stopping of the exit-side nip roller for a short period of time after the entrance-side nip roller stops once it has fed the sensitive material through a predetermined length.

More specifically, the foregoing and other objects of the invention are attained by an image forming method using a photosensitive and pressure-sensitive material in which a pair of nip rollers provided respectively at an exposure entrance and an exposure exit for setting the photosensitive and pressure-sensitive material in an exposure portion are actuated during relatively different time periods so as to hold the sensitive material without sagging during exposure.

It is a further object of the invention to provide an image forming method in which the time required for conveying the photosensitive and pressure-sensitive material is reduced to thereby shorten the time required for duplicating each sheet.

These and other objects of the invention have been attained in accordance with another aspect of the present invention by immediately conveying fresh sensitive material to the exposure position immediately following the completion of each exposure operation.

DESCRIPTION OF THE PREFERRED EMBODIMENTS

The sensitive material of the type in which a polymerizable compound is hardened to form a latent image and pressure is exerted to the material to form a visible image as disclosed in the above-discussed Japanese Unexamined Patent Publication No. 57-179836 may be used as the sensitive material in the method according to the present invention. The material is formed of a support carrying synthetic high-molecular-resin walled capsules each containing a vinyl compound, a photopolymerization initiator, and a colorant precursor. Also, a sensitive material of the type in which silver halide is developed after exposure, a polymerizable compound is simultaneously hardened in a pattern corresponding to the applied image, and pressure is applied to form a visible image, as disclosed in the above-discussed Japanese Unexamined Patent Publication No. 61-278849, may be also used as the sensitive material in the method according to the present invention. The material disclosed in Japanese Unexamined Patent Publication No. 61-278849 is used for forming a picture image on an image-receiving material having an image-receiving layer by transferring color image forming matter to the image-receiving material after thermal development. The material is formed at least by applying photosensitive silver halide, a reducing agent, a polymerizable compound, and a color image forming material onto a support, with the polymerizable compound and the color image forming material being enclosed in capsules.

As described above, the present invention provides an image forming method using a photosensitive and pressure-sensitive material in which a pair of nip rollers provided respectively at an exposure entrance-side and at an exposure exit-side for setting the sensitive material in an exposure portion have relatively different operating timings so as to transport the sensitive material without sag during exposure.

Three preferred embodiments of the invention are contemplated. In accordance with a first embodiment of the inventive method, stopping of the exit-side nip roller is delayed for a short time after the entrance-side nip roller has stopped after the sensitive material has been fed through a predetermined length, and both nip rollers are simultaneously actuated when the material is being exposed to light. In a second embodiment, the operation of the exit-side nip roller starts before the operation of the entrance-side nip roller, whereby sag of the material is removed before the exposure starts. Finally, in a third embodiment, the entrance-side nip roller serves as a free roller after it feeds the sensitive material; that is, only the exit-side roller is operated to remove the sag of the sensitive material during exposure.

The preferred embodiments of the invention will be further described in detail with reference to the drawings. However, the invention is not limited to these specific embodiments.

Figure 3A:
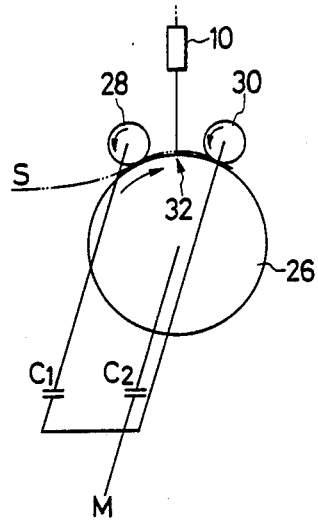
FIGS. 3A and 3B are schematic side views for explaining examples of an image forming method according to the present invention.
Figure 2:
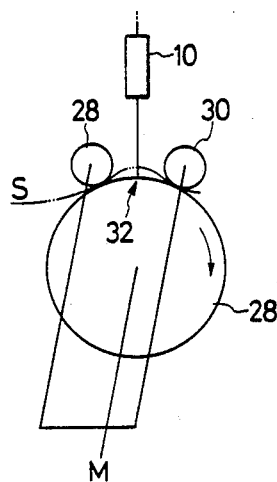
FIG. 2 is a side schematic view for explaining an example of prior art image forming method.

FIG. 3A shows an exposure portion of a copier apparatus including an exposed material supporting roller 26, an entrance-side nip roller 28, and an exit-side nip roller 30. In FIG. 3A, the photosensitive and pressure-sensitive material S which enters between the exposed material supporting roller 27 and the entrance-side nip roller 28 strikes the surface of the exit-side nip roller 30 due to its own curl, resulting in sagging at the exposure position 32, as shown in FIG. 2 and as described above.

Clutches $C_1$ and $C_2$ stop the operation of the exposed material supporting roller 26 and the operation of the entrance-side sensitive material nip roller 28 when the sensitive material has been conveyed through a predetermined length. The operation of the exit-side nip roller 30 is stopped after about 0.1 to 3 seconds from that instant, preferably after 0.5 seconds, to thereby eliminate the sag of the sensitive material S so that it can be closely and exactly set at the exposure position 32. Alternatively, the operation of the exit-side nip roller 30 may be stopped at the same time the operation of the entrance-side nip roller 28 is stopped. In this case, the operation of the exit side nip roller 28 is restarted earlier than the entrance-side nip roller 28 at the start of exposure to thereby eliminate the sag of the sensitive material S, whereafter the clutch $C_1$ is closed so that the sensitive material S is conveyed by both nip rollers. Otherwise, after the entrance-side nip roller 28 has conveyed the sensitive material S through a predetermined length, the clutch $C_1$ may be opened so that the entrance-side nip roller 28 serves as a free roller. In this case, while the entrance-side nip roller 28 serves as a free roller, the exit-side nip roller 30 is singly operated during the exposure operation.

Figure 3B:
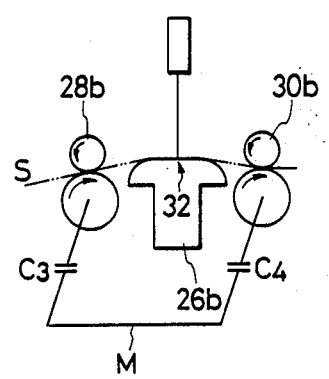

FIG. 3B illustrates a modification of the above embodiments of the invention, in which an entrance-side nip roller 28$b$ and an exit-side nip roller 30$b$ are independently provided on opposite sides of an exposure table 26$b$. The entrance-side nip roller 28$b$ nips the photosensitive and pressure-sensitive material S to move it to the exposure position 32. The sag of the sensitive material S which arises initially at the exposure position 32 may be eliminated in any of the ways described above with reference to FIG. 3A. For instance, sag may be eliminated by opening a clutch $C_4$ after about 0.1 to 3 seconds, preferably, 0.5 seconds, from the point in time when the other clutch $C_3$ is opened. That is, the stopping of the operation of the exit-side nip roller 30$b$ is delayed relative to the stopping of the entrance-side nip roller 28$b$. As a result, the sag of the photosensitive and pressure-sensitive material S at the exposure position 32 is entirely eliminated.

Figure 1:
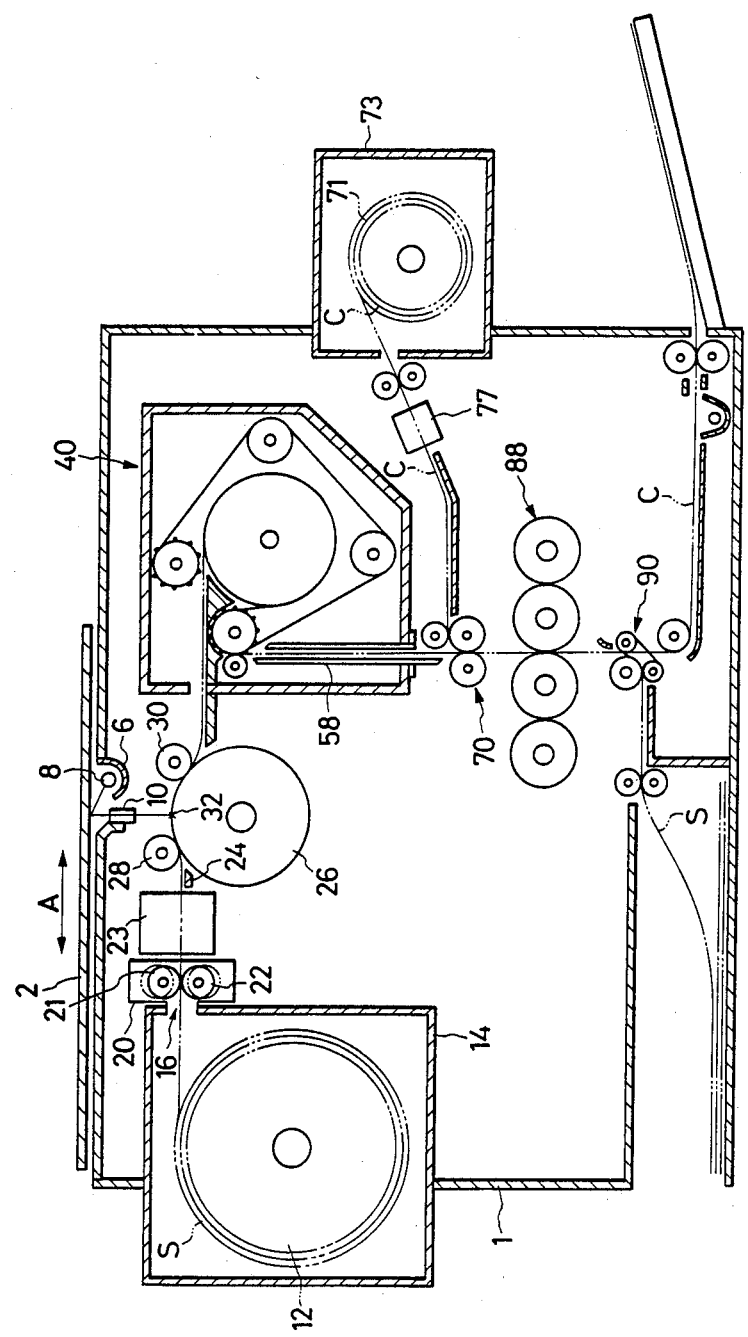
FIG. 1 is a side view of an apparatus to which the image forming method of the invention can be applied to advantage.

Applying the invention to the image forming apparatus shown in FIG. 1, entrance-side and exit-side nip rollers having a diameter of 10 mm were brought into contact with an exposed sensitive material supporting roller. The exit-side nip roller was stopped 0.5 seconds after the point in time when the entrance-side roller was stopped. As a result, the photosensitive and pressure-sensitive material was set in the correct exposure position without sag. The photosensitive and pressure-sensitive material at the exposure position was in close contact with the roller so that an accurately focused image was obtained.

As described above, according to the invention, the photosensitive and pressure-sensitive material being fed to the exposure position is conveyed in such a manner that all sag is eliminated. This is accomplished by proper timing of the actuation and stopping of the various rollers involved in the conveyance of the sensitive material. Thus, exposure is always carried out with the sensitive material set in the proper state for exposure. As a result, a correctly focused image is always obtained.

The conveying rollers used to set the sensitive material in the correct exposure position are located out of the areas where the sensitive material is superposed on the image-receiving paper and separated from the paper. Accordingly, the conveying rollers never interfere with the resulting image.

The method according to the invention is equally applicable to the case where the sensitive material supply is not in roll form. For example, the sensitive material may be supplied in the form of cut sheets.

As described above, further according to the image forming method of the invention, at the end of each exposure operation, fresh sensitive material is immediately conveyed to the exposure position. Accordingly, the time required for conveying the sensitive material to the exposure position before exposure can take place is eliminated. Consequently, the time required for duplicating each sheet is correspondingly shortened.

In another embodiment, a mechanism is provided for automatically conveying the sensitive material to the exposure position 32 through the nip rollers 28 and 30 immediately following the loading of a new sensitive material cartridge in the apparatus as shown in FIG. 1. Thus, the time required for exposing a first sheet can be shortened to about 10 seconds from about 20 seconds.

As described above, the invention provides an image forming method using a photosensitive and pressure-sensitive material in which a pair of nip rollers provided respectively at an entrance side and an exit side for conveying the photosensitive and pressure-sensitive material to the exposure portion are operated with relatively different timings to convey the sensitive material without sag during exposure. Accordingly, all sag of the sensitive material at the exposure position is eliminated to thereby obtain a correctly focused image.

Further, the invention provides an image forming method in which fresh photosensitive and pressure-sensitive material is conveyed to the exposure position immediately following the completion of each exposure operation. Accordingly, the time required for duplicating each sheet is significantly shortened.

What is claimed is:

1. An image forming method in which an entrance-side nip roller and an exit-side nip roller, disposed in contact with exposed material supporting means on opposite sides of an exposure position, are employed to convey photosensitive and pressure-sensitive material from a supply position to said exposure position, the improvement comprising operating said entrance-side and exit-side nip rollers with a differential timing so as to remove any sag in said photosensitive and pressure-sensitive material.

2. The image forming method of claim 1, wherein said step of operating said entrance-side and exit-side nip rollers with a differential timing comprises stopping said exit-side nip roller a predetermined time following stopping of said entrance-side nip roller.

3. The image forming method of claim 2, wherein said predetermined time is in a range of approximately 0.1 to 3 seconds.

4. The image forming method of claim 3, wherein said predetermined time is approximately 0.5 seconds.

5. The image forming method of claim 1, wherein said step of operating said entrance-side and exit-side nip rollers with a differential timing comprises starting operation of said exit-side nip roller before starting operation of said entrance side nip roller.

6. The image forming method of claim 1, wherein said step of operating said entrance-side and exit-side nip rollers with a differential timing comprises operating said entrance-side nip roller as a free roller during an exposure operation of said photosensitive and pressure-sensitive material.

7. The image forming method of claim 1, further comprising the step of feeding fresh photosensitive and pressure-sensitive material to said exposure position immediately following each exposure operation.

8. The image forming method of claim 1, wherein said exposed material supporting means comprises a supporting roller.

9. The image forming method of claim 1, wherein said exposed material supporting means comprises a supporting table.

* * * * *